United States Patent [19]
Yen et al.

[11] Patent Number: 5,789,314
[45] Date of Patent: Aug. 4, 1998

[54] METHOD OF TOPSIDE AND INTER-METAL OXIDE COATING

[75] Inventors: Chu-Tsao Yen; Shih-Ked Lee, both of Fremont; Tong Zhang; Pailu Wang, both of San Jose; Chuen-Der Lien, Los Altos, all of Calif.

[73] Assignee: Integrated Device Technology, Inc., Santa Clara, Calif.

[21] Appl. No.: 567,648

[22] Filed: Dec. 5, 1995

[51] Int. Cl.$^6$ .............................................. H01L 21/4763
[52] U.S. Cl. .................. 438/622; 438/626; 438/631; 438/639; 438/668; 438/778; 438/945
[58] Field of Search ............................ 437/195, 228; 438/622, 626, 631, 639, 668, 778, 945

[56] References Cited

U.S. PATENT DOCUMENTS

| | | | |
|---|---|---|---|
| 5,001,079 | 3/1991 | Van Laarhoven et al. | 438/945 |
| 5,278,103 | 1/1994 | Mallon et al. | 437/240 |
| 5,296,092 | 3/1994 | Kim | 156/643 |
| 5,302,233 | 4/1994 | Kim | 156/636 |
| 5,382,547 | 1/1995 | Sultan et al. | 437/231 |
| 5,393,708 | 2/1995 | Hsia et al. | 437/228 |
| 5,508,233 | 4/1996 | Yost et al. | 437/228 |
| 5,591,677 | 1/1997 | Jeng | 437/228 |

*Primary Examiner*—Charles L. Bowers, Jr.
*Assistant Examiner*—Lynne A. Gurley

[57] ABSTRACT

A method is provided for suppressing or eliminating void formation during the manufacture of integrated circuits. TEOS is deposited and etched to form recesses that assist in eliminating or suppressing void formation. The recesses may be located in an interlevel layer, or within the oxide layer just beneath the passivation layer.

19 Claims, 2 Drawing Sheets

METHOD OF TOPSIDE AND INTER-METAL OXIDE COATING

BACKGROUND OF THE INVENTION

In the manufacture of integrated circuits, CVD nitride is widely used as the final protective layer to protect the die against contamination and scratches. As device geometries continue to shrink, conductive lines become more closely spaced to each other. As a result the protective layer can not be deposited with uniform thickness above the conductive lines. Thickness at the top of the step exceeds the thickness between the lateral surfaces of the steps. Due to its relatively poor step coverage, the deposited protective layer is highly reentrant, and poses a severe threat to device reliability. The reentrant nature of the protective layer is shown in FIG. 1(a); this reentrant nature causes the voids in FIG. 1(b) to form. Air bubbles can be trapped inside these narrow openings while a photoresist layer is being applied to the protective layer. The trapped air within the voids can erupt at weak locations during the resist bake to form resist holes. Without photoresist protection, of the protective layer, the protective layer can be etched away, and the underlying conductive lines exposed during the subsequent etching of the photoresist mask.

Recently chemical-mechanical polishing (CMP) has acquired wide acceptance as a process that can offer truly global planarity for ever shrinking device geometries. To planarize inter-metal oxide using CMP, one of the key concerns is the void formation in thick dielectric film. Voids can interfere with the CMP polish by trapping slurry and residues from the CMP process, thereby causing serious reliability concerns.

U.S. Pat. No. 5,278,103 (Mallon) discusses void formation in the manufacture of integrated circuits and is incorporated by reference herein. Mallon is interested in retaining voids created during the fabrication of integrated circuits to lower the dielectric constant of such devices. This advantage can be achieved if such voids are consistently formed within the spaces between neighboring metal lines. Unless such consistency is achieved, the signal transport properties will differ from one metal line to the next. As a result, control of the signal properties in Mallon would be difficult unless voids were formed having the same size and same comparable location throughout the die.

General principles of plasma enhanced chemical vapor deposition that may be applicable to this invention are described in U.S. Pat. No. 5,362,526, which is incorporated by reference herein.

SUMMARY OF THE INVENTION

The present invention is designed to overcome the above drawbacks in the prior art and is summarized below.

The present invention concerns a method for manufacturing a semiconductor structure using the following steps:

a) depositing a conductive layer on a surface;

b) etching said conductive layer to form conductive lines separated by spaces;

c) overlaying said conductive lines with an oxide layer;

d) removing a portion of said oxide layer to create recesses at regular intervals; and e) conformally depositing a protective layer after step d).

After depositing the conductive layer, spaces are etched out of the conductive layer to form metal lines. A desired thickness of oxide is then deposited on the upper surface of the resulting structure. This oxide layer is then etched back to change the contour of oxide layer covering the conductive lines and to form recesses between the conductive lines. Thereafter, a protective layer is conformally deposited over the oxide layer. The formation of voids is minimized or altogether eliminated during the deposition of the protective layer due to the recesses and other selected features of the invention.

DETAILED DESCRIPTION OF THE INVENTION

Figure 1A:
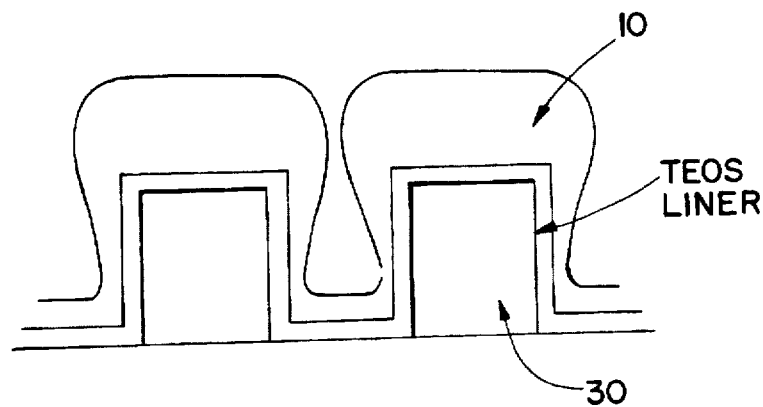
FIG. 1(a) is a cross-section of a portion of an integrated circuit after a nitride coating has been deposited according to conventional processes.
Figure 1B:
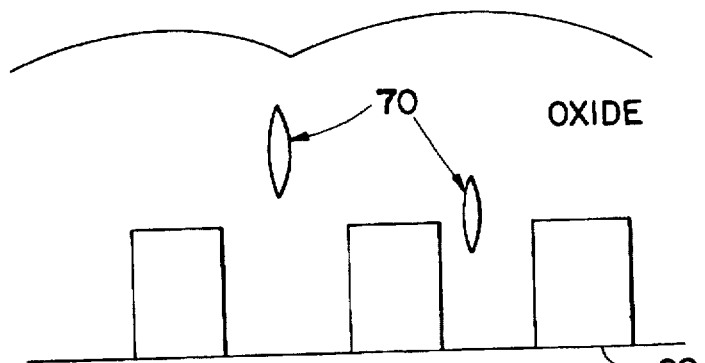
FIG. 1(b) illustrates void formation that interferes with standard planarization.
Figure 2A:
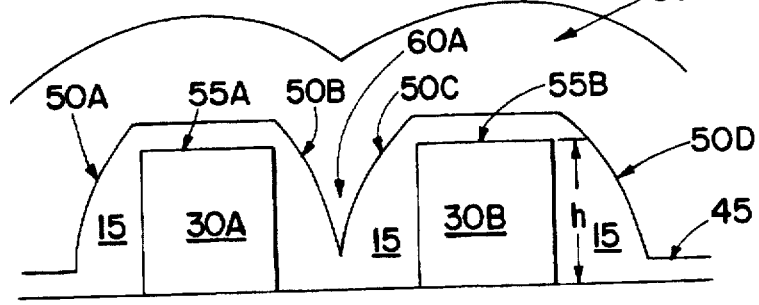
FIG. 2(a) illustrates step coverage in an integrated device produced in accordance with the present invention.

As mentioned above, conventional processes of depositing dielectric passivation layers are hindered by poor step coverage. FIG. 1(b) illustrates how void formation can occur when an oxide layer of more than 15,000 Å is deposited onto tightly spaced, conductive lines 20. The adverse impact to the die is visible by the presence of cusping. Turning to FIG. 2(a), cusping is prevented from creating voids by restricting the thickness of the protective layer (80).

Figure 2B:
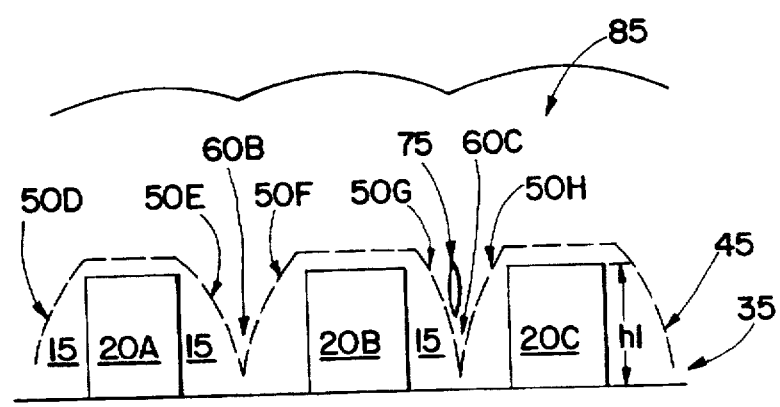
FIG. 2(b) illustrates, in cross section, the formation of a void within a pair of sidewalls.
Figure 3:
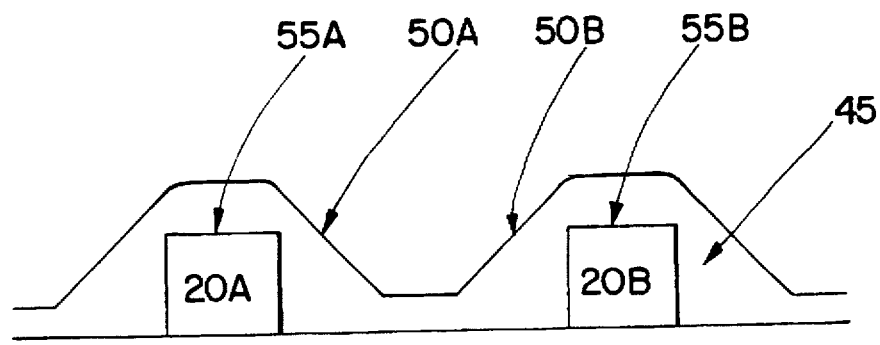
FIG. 3 illustrates, in cross section, an alternative shape of the coating that serves to reduce or eliminate voids in accordance with the present invention.

FIGS. 2(a), 2(b) and 3 show cross sections of an integrated device produced in accordance with the present invention. Elements in FIGS. 2(a) and 2(b) which have the same reference numerals as elements in FIG. 3 correspond to the elements in FIG. 3.

The present invention is directed to a method for manufacturing a semiconductor structure using the following steps:

a) depositing a conductive layer on a surface;

b) etching said conductive layer to form conductive lines separated by spaces;

c) overlaying said conductive lines with an oxide layer;

d) removing a portion of said oxide layer to create recesses at regular intervals; and e) conformally depositing a protective layer after step d).

Suitable conductive material may be selected from either polysilicon or conventional metals used in the semiconductor industry. For example, the metal may be an alloy of Al-Si or Al-Si-Cu. On the other hand, the metal may be an alloy of aluminum and metal oxide, further alloyed with one or more elements of tungsten, nickel or nitride. The metal oxide may be selected from tungsten oxide, nitride oxide or any other equivalent oxide.

The conductive layer of the invention is deposited onto a surface such as a silicon substrate or an insulating layer. For example, the conductive layer may comprise a topmost metal layer (30) shown in FIG. 2(a). Alternatively, the conductive layer may be sputtered on the interlevel insulating surface (35) shown in FIG. 2(b).

After the conductive layer is etched to provide spaces or gaps (15) therein, an oxide layer (45) is conformally deposited thereon. The oxide layer in both embodiments shown in FIGS. 2(a) and 2(b) is subsequently etched to form recesses (60). The oxide layer (45) and conductive layers (30A, 30B and 30C) are etched using anisotropic etching or a combination of anisotropic and isotropic etching. Specific types of etching that are preferred include sputter etching and RIE (reactive ion etching). Conventional etchants may be used to practice this invention.

The oxide and nitride layers may be deposited using conventional chemical vapor deposition. Preferably, the CVD method used is plasma enhanced chemical vapor deposition at temperatures ranging from between 350°–400° centigrade. The thickness of the oxide layer deposited on the upper surface (55A and 55B) of the metal lines is preferably between about 1,500 Å and 3,000 Å after etchback. During the etchback step, the oxide layer is etched to form sidewalls (50A through 50D) and recesses (60A through 60C) at regular intervals as shown in FIGS. 2(a) and 2(b).

The recesses formed are characterized by a pair of sloped sidewalls (50B and 50C, 50E and 50F, 50G and 50H) positioned within said spaces. The slope of one sidewall (e.g. 50B) may converge with the slope of another sidewall (e.g. 50C), but this is not essential. In another embodiment the facing sidewalls 50A and 50B may be shaped as shown in FIG. 3 using a combination of anisotropic and isotropic etching. The aspect ratio at a first point within said pair of sidewalls varies significantly from an aspect ratio at a point vertically spaced from said first point.

Figures 4A, 4B:
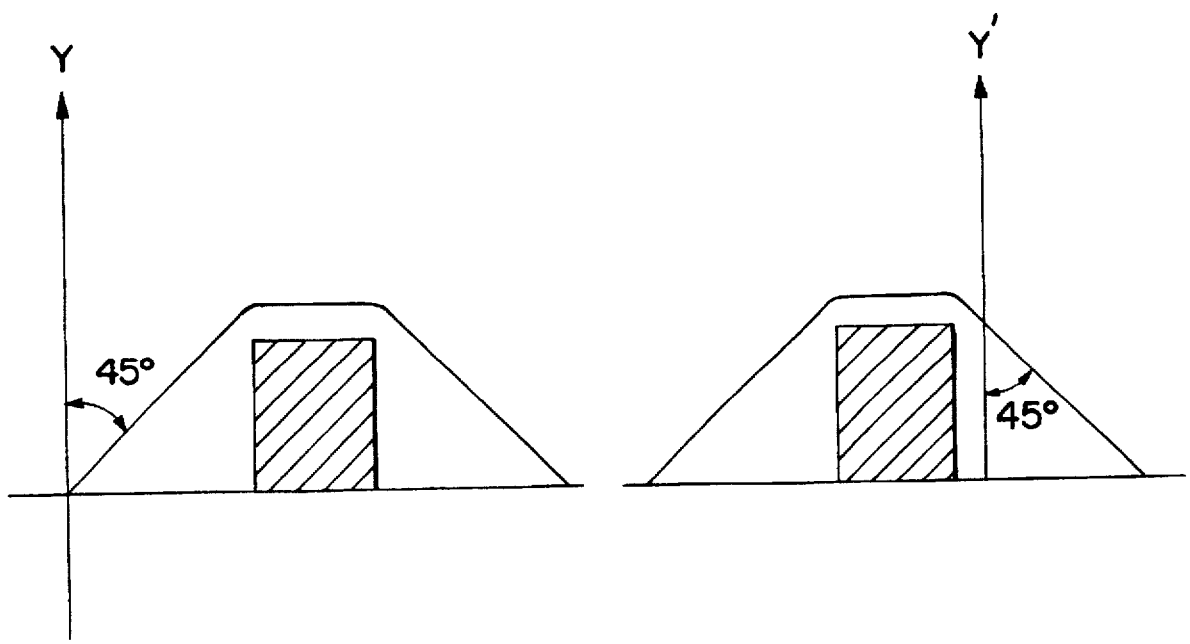
FIG. 4(a) illustrates the desired angle of the coating sidewalls in one aspect of the present invention.
FIG. 4(b) illustrates the desired angle of the coating sidewalls in another aspect of the present invention.

The recesses are characterized by having a slope on one edge of each sidewall (50). A relatively tapered slope between 0° and 45° from the vertical is preferred. An angle of approximately 45° from the vertical is especially preferred as shown in FIGS. 4A and 4B. Such a tapered slope will allow the recesses (60) to eliminate voids or confine voids below, or slightly above, the upper surface of the conductive line during deposition of the protective layer.

A void may be considered to be a pocket of air or any gas, or an imperfection that is produced by poor step coverage of a particular layer. Voids (75) are preferentially formed within a pair of sloped sidewalls (e.g. 50G and 50H). Alternatively, the void (75) may be positioned below the upper surface of the conductive line (55A through 55C). Still, in another embodiment of the invention, the void may be slightly above the upper surface of the conductive line. However, the void is preferably located no closer than 3000 Å from the oxide layer (45) after it has been planarized or etched back. In other words, the void is preferably located a distance of 3000 Å or greater from the upper surface (46C) of the oxide layer or the planarized insulating layer. In yet another embodiment of the invention, the void or imperfection is completely suppressed.

The protective layer is deposited after the oxide layer (45) is etched. The protective layer may constitute either a passivation layer (80) as shown in FIG. 2(a), or a dielectric layer (85) as shown in FIG. 2(b). Preferably, the dielectric layer is an oxide. More preferably, the oxide layer comprises TEOS (tetraethylorthosilicate) and is deposited by chemical vapor deposition. Alternatively, the passivation layer (80) of the invention may be a nitride-containing layer, such as silicon nitride, silicon oxynitride or any other similar nitride.

The thickness at which the oxide layer is deposited will vary according to which oxide is used and whether the oxide layer is being deposited onto a topmost conductive layer 30 as in FIG. 2(a) or onto an interlevel conductive layer (20) as in FIG. 2(b). The last conductive layer to be deposited before the passivation layer constitutes the topmost conductive layer.

In the embodiment shown in FIG. 2(a), between 10,000 Å to 12,000 Å of a TEOS layer (45) is deposited prior to the passivation layer (80). Whereas, in the embodiment of FIG. 2(b), between 5,000 Å and 8,000 Å of TEOS (45) is deposited onto the interlevel conductive lines (20A through 20C). In either case, the oxide layer (45) is subject to an etchback step, that stops when a thickness of between 1500 Å and 3000 Å of oxide is reached. In the preferred embodiment featured in FIG. 2(a), the oxide layer is etched back to a thickness of 2500 Å; in the preferred embodiment of FIG. 2(b), the oxide layer is etched back to a thickness of 2000 Å and the dielectric layer is then planarized using conventional CMP (chemical-mechanical polishing) techniques.

In an alternative embodiment, the conductive lines (30A through 30C or 20A through 20C) are formed of polysilicon. In which case, the oxide layer (45) is etched as when 20A through 20C (or 30A through 30C) is a metal conductor, but with the additional etching of all oxide in direct contact with the upper surface (55A through 55C) of the polysilicon. The result is that oxide sidewall spacers are formed.

In either of the above described embodiments, the height (h) of the conductive lines ranges from 10,000 Å to 14,000 Å when comprising the topmost conductive layer as in FIG. 2(a). In this case, the preferred height for the conductor is 12,000 Å. The height (h1) of the conductive lines is preferably shorter when the invention is practiced on interlevel conductive layers as in FIG. 2(b). Specifically, heights ranging from 7,000 Å to 10,000 Å are appropriate for interlevel conductive lines.

The spacing between the conducting lines will vary and are not a limitation to this invention. It is expected that the invention will work with all types of spacing known to be present in all functioning transistors at this time.

Although preferred embodiments have been described above, it is understood that various variations may be incorporated without departing from the spirit and the scope of the invention. Hence, the invention may be applicable to semiconductor devices having any number of metal layers. For example, from two to five layers depending on the desired complexity of the device. Moreover, when the protective layer overlays a topmost conductive line within a device it serves to enhance device reliability by supporting the conductive lines against shifting and lifting during the packaging stage.

EXAMPLE 1

A metal layer of approximately 9000 angstroms is deposited on a surface, in this case, on a doped thin film such as BPSG. The metal layer is etched to form metal lines having spaces therebetween. An oxide layer of TEOS is conformally deposited on the metal lines. This oxide layer is isotropically etched to form a coating having tapered sidewalls within the spaces separating each metal line. On the oxide coating a thick layer of TEOS oxide is deposited in an amount of 2 microns or 20,000 Å. The TEOS oxide is polished back to a thickness of about 10,000 Å. A cap layer is deposited on the TEOS and consists of any suitable oxide material, such as TEOS or silane oxide. The total thickness from the upper surface of the cap layer to the upper surface of the metal 1 layer immediately underlying the first deposited TEOS layer is about 15,000 Å.

A via is thereafter opened in the cap layer using conventional methods. At which point a second layer of metal is deposited above the via and the process described above is repeated to prevent or minimize the formation of voids within interlevel and top layers as well. cl EXAMPLE 2

A topmost metal layer of approximately 1100 angstroms is sputtered onto a surface within an interconnect structure.

The metal layer is etched to form metal lines having spaces of approximately 0.50 microns wide between neighboring lines. Prior to depositing the passivation layer such as silicon oxynitride, a layer of TEOS is deposited to a thickness of 11,000 Å. Part of this TEOS layer is etched back using reactive ion etching to leave about 2500 Å of TEOS on top of the metal lines. During this etch sequence, tapered sidewalls are formed and a thin layer of TEOS oxide remains in contact with the upper surface of each metal line. Thereafter the silicon oxynitride layer is deposited. As a result, void formation is minimal. Where voids occurred they were located beneath the upper surface of the metal lines, or at a distance of more than approximately 3000 Å away from the top surface of the silicon oxynitride layer.

What is claimed is:

1. A method for manufacturing a semiconductor structure comprising:
   a) depositing a conductive layer on a surface;
   b) etching said conductive layer to form conductive lines separated by spaces said conductive lines having an upper surface and side surfaces;
   c) overlaying said conductive lines and said spaces with an oxide layer;
   d) removing a portion of said oxide layer to form a recess, while leaving a portion of said oxide layer on said upper surface of said conductive lines and in said spaces separating said conductive lines, wherein said recess comprises a pair of sloped sidewalls formed between each of said conductive lines and wherein the slope of each sidewall converges with the slope of another sidewall to a point; and
   e) conformally depositing a protective layer over said oxide layer after said recess is formed.

2. The method of claim 1, wherein said conductive layer comprises a metal.

3. The method of claim 1, wherein said surface comprises a substrate.

4. The method of claim 1, wherein said surface comprises a dielectric layer.

5. The method of claim 1, wherein said protective layer comprises a passivation layer or a dielectric layer.

6. The method of claim 5, wherein said passivation layer is a nitride-containing layer.

7. The method of claim 5, wherein said dielectric layer comprises TEOS.

8. The method of claim 5, wherein said protective layer is subject to an etchback step.

9. The method of claim 1, wherein said oxide layer comprises TEOS.

10. The method of claim 4, wherein between 5,000 Å and 8,000 Å of TEOS is deposited onto said conductive lines.

11. The method of claim 10, wherein between 10K Å to 12K Å of a TEOS layer is deposited prior to said protective layer.

12. The method of claim 11, further comprising planarizing said dielectric layer.

13. The method of claim 12, wherein voids are formed at least 3000 Å below an upper surface of said dielectric layer after said dielectric layer is planarized.

14. The method of claim 10, further comprising etching back said oxide layer to a thickness of between about 1500 Å and 3000 Å.

15. The method of claim 1, wherein said protective layer is deposited by chemical vapor deposition.

16. The method of claim 1, wherein said sloped sidewall is between 0° and 45° from the vertical.

17. The method of claim 1, wherein the slope of each sidewall of said pair of sloped sidewalls suppress void formation in said protective layer.

18. The method of claim 1, wherein said pair of sloped sidewalls suppress void formation above an upper surface of said conductive lines.

19. The method of claim 1, wherein voids are formed within said pair of sloped sidewalls.

* * * * *